United States Patent
Son et al.

(10) Patent No.: US 8,648,671 B2
(45) Date of Patent: Feb. 11, 2014

(54) BULK ACOUSTIC WAVE RESONATOR STRUCTURE, A MANUFACTURING METHOD THEREOF, AND A DUPLEXER USING THE SAME

(75) Inventors: Sang Uk Son, Yongin-si (KR); In Sang Song, Osan-si (KR); Young Il Kim, Suwon-si (KR); Duck Hwan Kim, Goyang-si (KR); Chul Soo Kim, Hwaseong-si (KR); Jea Shik Shin, Hwaseong-si (KR); Hyung Rak Kim, Seoul (KR); Jae Chun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 382 days.

(21) Appl. No.: 13/088,905

(22) Filed: Apr. 18, 2011

(65) Prior Publication Data

US 2012/0049976 A1 Mar. 1, 2012

(30) Foreign Application Priority Data

Sep. 1, 2010 (KR) ........................ 10-2010-0085606

(51) Int. Cl.
*H03H 9/70* (2006.01)
*H03H 9/13* (2006.01)
*H03H 9/54* (2006.01)

(52) U.S. Cl.
USPC ............................ 333/133; 333/189; 310/324

(58) Field of Classification Search
USPC .................. 333/133, 187, 189; 310/322, 324
See application file for complete search history.

(56) References Cited

U.S. PATENT DOCUMENTS

| | | | |
|---|---|---|---|
| 7,321,183 B2 * | 1/2008 | Ebuchi et al. | 310/324 |
| 7,484,279 B2 * | 2/2009 | Aoki | 29/25.35 |
| 7,579,926 B2 * | 8/2009 | Jhung | 333/133 |
| 7,675,388 B2 | 3/2010 | Cardona et al. | |
| 7,863,699 B2 * | 1/2011 | Dropmann et al. | 257/416 |
| 2002/0121337 A1 * | 9/2002 | Whatmore et al. | 156/285 |
| 2006/0038636 A1 * | 2/2006 | Tsurumi et al. | 333/191 |

(Continued)

FOREIGN PATENT DOCUMENTS

JP 2005-295250 * 10/2005
JP 2005-347898 12/2005

(Continued)

*Primary Examiner* — Barbara Summons
(74) *Attorney, Agent, or Firm* — NSIP Law

(57) ABSTRACT

A Bulk Acoustic Wave Resonator (BAWR), a method of manufacturing of the BAWR, and duplexer including the BAWR are provided. The BAWR may include a first substrate including a via hole formed in a predetermined area of a bottom surface of the first substrate. A first air cavity may be formed above the first substrate, and a first lamination resonating portion may be laminated above the first air cavity in sequence of a lower electrode, a piezoelectric layer, and an upper electrode. A second air cavity may be formed above the first substrate, and a second lamination resonating portion may be laminated above the second air cavity in sequence of the lower electrode, the piezoelectric layer, and the upper electrode. The first lamination resonating portion and the second lamination resonating portion may be connected via either the lower electrode or the upper electrode. A first electrode portion may include a third air cavity formed on a bottom surface of either the lower electrode or the upper electrode connecting between the first lamination resonating portion and the second lamination resonating portion.

10 Claims, 7 Drawing Sheets

(56) References Cited

U.S. PATENT DOCUMENTS

| | | | |
|---|---|---|---|
| 2007/0117245 A1* | 5/2007 | Lee et al. | 438/50 |
| 2007/0200146 A1* | 8/2007 | Onishi et al. | 257/202 |
| 2008/0143215 A1* | 6/2008 | Hara et al. | 310/328 |
| 2009/0134957 A1* | 5/2009 | Shin | 333/187 |
| 2010/0107387 A1 | 5/2010 | Song et al. | 29/25.35 |
| 2010/0327697 A1* | 12/2010 | Choy et al. | 310/335 |
| 2010/0327994 A1* | 12/2010 | Choy et al. | 333/187 |

FOREIGN PATENT DOCUMENTS

| | | |
|---|---|---|
| JP | 2007-295306 * | 11/2007 |
| JP | 2008-118480 | 5/2008 |
| JP | 2008-236795 | 10/2008 |
| KR | 10-0555762 | 2/2006 |
| KR | 10-0622393 | 9/2006 |
| KR | 10-2008-0015632 | 2/2008 |

* cited by examiner

310

BULK ACOUSTIC WAVE RESONATOR STRUCTURE, A MANUFACTURING METHOD THEREOF, AND A DUPLEXER USING THE SAME

CROSS-REFERENCE TO RELATED APPLICATION(S)

This application claims the benefit under 35 U.S.C. §119 (a) of Korean Patent Application No. 10-2010-0085606, filed on Sep. 1, 2010, in the Korean Intellectual Property Office, the entire disclosure of which is incorporated herein by reference for all purposes.

BACKGROUND

1. Field

The following description relates to a Bulk Acoustic Wave Resonator (BAWR) and a method of manufacturing the BAWR, and a duplexer using a BAWR.

2. Description of Related Art

A Bulk Acoustic Wave Resonator (BAWR) may be operated through electrodes located above and below a piezoelectric layer. When a high-frequency potential is applied to the electrodes, the BAWR may be operated as a filter by vibrating the piezoelectric layer.

To improve an acoustic wave reflection characteristic, the BAWR may float in the air from a substrate through an air cavity. In a BAWR having a frequency band pass characteristic, a plurality of resonators may be arranged on a plane to improve a reflection characteristic or a transmission characteristic in a frequency band range, and may be connected via a common electrode. Here, the electrode connecting the plurality of resonators may be attached onto a substrate. Power may be lost in the electrode attached onto the substrate. To better realize characteristics of a resonator in a designed frequency band, a power loss in an electrode should be reduced.

SUMMARY

In one general aspect, there is provided a Bulk Acoustic Wave Resonator (BAWR) including a first substrate having a via hole positioned in a predetermined area of a bottom surface of the first substrate, a first lamination resonating portion having a first air cavity, and a first lower electrode-piezoelectric layer-upper electrode laminate, the first air cavity being formed above the first substrate, and the first lower electrode-piezoelectric layer-upper electrode laminate being positioned above the first air cavity. The BAWR further includes a second lamination resonating portion having a second air cavity, and a second lower electrode-piezoelectric layer-upper electrode laminate, the second air cavity being formed above the first substrate, and the second lower electrode-piezoelectric layer-upper electrode laminate being formed above the second air cavity. A first electrode portion is formed to connect the first lamination resonating portion and the second lamination resonating portion via either a lower electrode or an upper electrode, the first electrode portion including a third air cavity formed below either the lower electrode or the upper electrode.

The BAWR may further include a second substrate including an air cavity formed in a predetermined area of a bottom surface of the second substrate, the second substrate being bonded to the first substrate.

The third air cavity may be formed either between the first substrate and the lower electrode or between the first substrate and the upper electrode.

The third air cavity may be formed by a via hole positioned below either the lower electrode or the upper electrode, and the via hole extends into the first substrate.

The BAWR may further include a second electrode portion including a fourth air cavity formed in either a bottom surface of the upper electrode or a bottom surface of the lower electrode, the upper electrode or the lower electrode being connected to an electrode laminated in the via hole of the first substrate. The first lamination resonating portion and the second lamination resonating portion may be connected to the electrode laminated in the via hole of the first substrate through either the upper electrode or the lower electrode.

The BAWR may further include a solder ball attached to an electrode laminated below the first substrate. The electrode may be laminated below the first substrate and in the via hole, and is configured to connect to an external element.

The BAWR may further include a solder ball attached to a surface of the via hole of the first substrate. The via hole of the first substrate may be filled with a conductive material.

The BAWR may further include a solder bump formed below an electrode laminated in the via hole of the first substrate and in a predetermined area below the first substrate. The laminated electrode may be configured to connect to an external element.

The third air cavity may be filled with a material having a high dielectric constant.

In another aspect, there is provided a duplexer using a Bulk Acoustic Wave Resonator (BAWR), the duplexer including a first filter configured to transmit, via an antenna, a signal input through a transmitting terminal and a second filter configured to control a signal received via the antenna to be output to a receiving terminal. The duplexer further includes a phase shifter configured to change a phase of a signal, and prevent an interference of the signal from occurring in the first filter and the second filter, the signal being transceived between the antenna and the second filter. The first filter and the second filter are operated at different predetermined resonance frequencies, and are implemented as a plurality of lamination resonating portions, each comprising an air cavity. The first filter and the second filter are configured to connect the plurality of lamination resonating portions via an electrode, and each of the first filter and the second filter includes an electrode portion having an air cavity formed below the electrode.

In another aspect, there is provided a method of manufacturing a Bulk Acoustic Wave Resonator (BAWR), the method including sequentially laminating a silicon oxide film, a silicon nitride film, and a sacrificial layer on a first substrate, patterning the sacrificial layer into shapes of a first air cavity, a second air cavity, and a third air cavity, the first air cavity, the second air cavity, and the third air cavity being respectively formed below a first BAWR, a second BAWR, and an electrode connecting the first BAWR and the second BAWR. The method further includes sequentially laminating a silicon oxide film, a silicon nitride film, and a first conductive layer on the patterned sacrificial layer, patterning a lower electrode in the first conductive layer, sequentially laminating a piezoelectric layer, and a second conductive layer on the lower electrode, and patterning an upper electrode in the second conductive layer. The method further includes forming the third air cavity by removing the sacrificial layer patterned below the electrode connecting the first BAWR and the second BAWR and forming a via hole in the first substrate by etching a bottom surface of the first substrate, so that either the lower electrode or the upper electrode is connected to an external element through the via hole.

The method may further include forming an air cavity in a predetermined area of a bottom surface of a second substrate, and bonding the second substrate to the first substrate using a metal.

The third air cavity may be formed by forming a via hole by etching the bottom surface of the first substrate in a location corresponding to a lower part of the electrode connecting the first BAWR and the second BAWR.

The method may further include depositing an insulating layer and a conductive layer in a lower part of a via hole formed below either the lower electrode or the upper electrode; and forming an electrode pad by patterning the conductive layer.

The method may further include coating a lower part of the electrode pad with a flux.

The method may further include forming a solder bump or a solder ball in the lower part of the electrode pad.

The method may further include filling the via hole with a conductive material and forming a solder bump or a solder ball below the via hole filled with the conductive material.

The filling may include filling the via hole using at least one of an electroplating scheme, an electroless plating scheme, and a solder paste filling scheme.

The patterning of the sacrificial layer may include patterning the sacrificial layer into a shape of a fourth air cavity to be formed below an electrode connecting the first BAWR and the via hole. The forming of the third air cavity may include forming the fourth air cavity to by removing the sacrificial layer patterned below the electrode connecting the first BAWR and the via hole.

The third air cavity may be formed by generating a via hole by etching the bottom surface of the first substrate in a location corresponding to a lower part of the electrode connecting the first BAWR and the second BAWR.

Other features and aspects will be apparent from the following detailed description, the drawings, and the claims.

Figure 1:
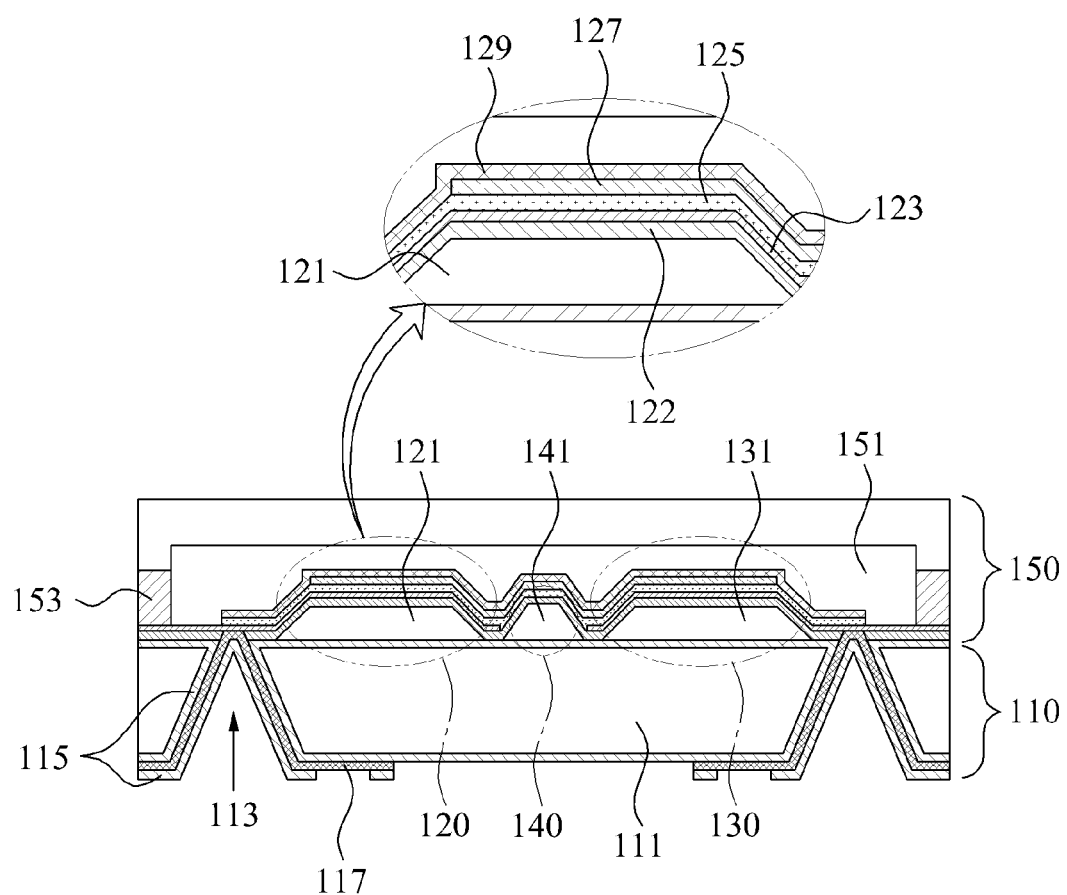
FIG. 1 is a diagram illustrating an example of a lamination structure of a Bulk Acoustic Wave Resonator (BAWR).

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. Also, description of well-known functions and constructions may be omitted for increased clarity and conciseness.

According to the examples below, a Bulk Acoustic Wave Resonator (BAWR) may function as a filter, a transmitter, a receiver or a duplexer that are used in a wireless communication device. The BAWR may be used to input or output wireless data. A type and use of a wireless communication device is being diversified, and devices which have traditionally been wired devices are being introduced as wireless device. Thus, a BAWR according to examples described herein may be used in various fields.

The BAWR refers to an apparatus for inducing a wave or an amplitude of a predetermined frequency using a resonance phenomenon, and may be used as a part of a Radio Frequency (RF) apparatus, for example a filter and an oscillator.

Hereinafter, a lamination structure of a BAWR according to various examples is described. Here, a first lamination resonating portion may include a first BAWR, and a second lamination resonating portion may include a second BAWR.

FIG. 1 illustrates an example of a lamination structure of a BAWR.

Referring to the example shown in FIG. 1, the lamination structure of the BAWR includes a first substrate 110, a first lamination resonating portion 120, a second lamination resonating portion 130, and a first electrode portion 140.

In this example, the first substrate 110 includes a via hole 113 formed in a predetermined area of a bottom surface of the first substrate 110. Here, the via hole 113 is configured to penetrate the first substrate 110 from the bottom surface of the first substrate 110, and connect a lower electrode 123 or an upper electrode 127 laminated above the first substrate 110 to an external element. More specifically, in this example, the lower electrode 123 or the upper electrode 127 may be connected to the external element via an electrode pad 117 generated on the via hole 113. The first substrate 110 may include a silicon substrate 111. An insulating layer 115 may be formed on the via hole 113 using insulating materials to expose only a predetermined area of the electrode pad 117.

The first lamination resonating portion 120 includes a first air cavity 121 and a first lower electrode-piezoelectric layer-upper electrode. The first air cavity 121 is formed above the first substrate 110 in this example. The "first lower electrode-piezoelectric layer-upper electrode" may refer to a structure where the lower electrode 123, a piezoelectric layer 125, and the upper electrode 127 are sequentially laminated above the first air cavity 121.

Specifically, the first lamination resonating portion 120 may include a sacrificial layer where the first air cavity 121 is to be formed, a membrane support layer 122, the lower electrode 123, the piezoelectric layer 125, the upper electrode 127, and a protective layer 129. Here, the membrane support layer 122 may support the first air cavity 121, and the protective layer 129 may protect an electrode using insulating materials.

Additionally, the first lamination resonating portion 120 may be connected to the external element through the via hole 113. Specifically, either the lower electrode 123 or the upper electrode 127 may be connected to the electrode pad 117 of the via hole 113, so that the first lamination resonating portion 120 may be connected to the external element. The first lamination resonating portion 120 may be connected to the second lamination resonating portion 130 through the first electrode portion 140 as shown in the example of FIG. 1.

The second lamination resonating portion 130 includes a second air cavity 131, and a second lower electrode-piezoelectric layer-upper electrode. The second air cavity 131 is formed above the first substrate 110 in this example. The "second lower electrode-piezoelectric layer-upper electrode" may be laminated above the second air cavity 131. Similar to the first lamination resonating portion 120, the second lamination resonating portion 130 may include a sacrificial layer where the second air cavity 131 is to be formed, a membrane support layer, a lower electrode, a piezoelectric layer, an upper electrode, and a protective layer. Here, the membrane support layer may support the second air cavity 131, and the protective layer may protect an electrode using insulating materials.

The "first lower electrode-piezoelectric layer-upper electrode" of the first lamination resonating portion 120 and the "second lower electrode-piezoelectric layer-upper electrode" of the second lamination resonating portion 130 may be formed through the same process. However, the "first lower electrode-piezoelectric layer-upper electrode" and the "second lower electrode-piezoelectric layer-upper electrode" may be formed in different shapes based on a level of patterning and etching. In other words, the "first lower electrode-piezoelectric layer-upper electrode" and the "second lower electrode-piezoelectric layer-upper electrode" may perform different functions, despite being formed using the same process. Here, the different shapes may include lengths, thicknesses, and the like.

The first electrode portion 140 is configured to connect the first lamination resonating portion 120 and the second lamination resonating portion 130 via either the lower electrode 123 or the upper electrode 127. The first electrode portion 140 includes a third air cavity 141 formed below either the lower electrode 123 or the upper electrode 127. The first electrode portion 140 may include a sacrificial layer where the third air cavity 141 is to be formed, a membrane support layer, the lower electrode, the piezoelectric layer, the upper electrode, and the protective layer. Here, the membrane support layer may support the third air cavity 141.

The third air cavity 141 may occupy an area that enables the first lamination resonating portion 120 and the second lamination resonating portion 130 to be isolated from each other. In other words, it may be beneficial to minimize a contact area between the first electrode portion 140 and the first substrate 110 so that the first lamination resonating portion 120 may be isolated from the second lamination resonating portion 130. Accordingly, a power loss via an electrode may be limited or prevented, and a driving power of the resonators may be reduced by minimizing or reducing the contact area between the first electrode portion 140 and the first substrate 110 through implementation of the third air cavity 141.

Additionally, the first air cavity 121, the second air cavity 131, and the third air cavity 141 respectively formed in the first lamination resonating portion 120, the second lamination resonating portion 130, and the first electrode portion 140 may be formed by removing the sacrificial layer and thus, the third air cavity 141 may be formed through the same manufacturing process above and with the same manufacturing costs as a conventional resonator manufacturing process, without an additional process. That is, the first, second and third air cavities 121, 131, 141 may be formed by forming the laminates of the first lamination resonating portion 120, second laminating resonating portion 130 and first electrode portion 140 around the sacrificial layer and then removing the sacrificial layer. Upon removal of the sacrificial layer, at least a portion the area formerly occupied by the sacrificial layer forms the respective first, second and third air cavities 121, 131, 141.

The third air cavity 141 of the first electrode portion 140 may be formed between the first substrate 110 and either the lower electrode 123 or the upper electrode 127. The third air cavity 141 may be filled with a material having a high dielectric constant. The material having the high dielectric constant may include, for example, air, inert gas, silicon oxide ($SiO2$), silicon nitride ($Si3N4$), polysilicon, polymer, and the like. These materials are listed for the purposes of example only, and the material filling the third cavity is not limited to the materials listed above.

The lamination structure of the BAWR further includes a second substrate 150. The second substrate 150 includes an air cavity 151 formed in a predetermined area of a bottom surface of the second substrate 150, and may be bonded to the first substrate 110. Specifically, the second substrate 150 may be bonded to the first substrate 110 using a bonding metal 153. For example, a polymer may be used as the bonding metal 153 to bond the second substrate 150 to the first substrate 110. Additionally, an anodic bonding scheme may be used to apply a voltage to the first substrate 110 and the second substrate 150, so that the first substrate 110 may be bonded to the second substrate 150. Other suitable bonding mechanisms may be employed as well.

In one example of a method of manufacturing a BAWR, a silicon oxide film, a silicon nitride film, and a sacrificial layer are sequentially laminated on the first substrate 110. Here, the silicon oxide film and the silicon nitride film may be used to protect the first substrate 110 during an etching operation. Accordingly, when those with knowledge in a field of lamination of a semiconductor or element are able to sufficiently infer the examples based on a manufacturing process and technology, the silicon oxide film and the silicon nitride film may be replaced with other materials for protecting the first substrate 110 during the etching operation, or may be omitted. Sacrificial materials used for the sacrificial layer may include, for example, polysilicon and polymer.

In this example, the sacrificial layer is patterned into shapes of a first air cavity 121, a second air cavity 131, and a third air cavity 141. The first air cavity 121, the second air cavity 131, and the third air cavity 141 may be respectively formed below the first lamination resonating portion 120, the second lamination resonating portion 130, and an electrode 140 connecting the first lamination resonating portion 120 and the second lamination resonating portion 130. The shapes of the first air cavity 121 and second air cavity 131 may be set based on characteristics of the BAWR, and the shape of the third air cavity 141 may be set as a shape which isolates the first lamination resonating portion 120 and the second lamination resonating portion 130.

Also, in this example, a silicon oxide film, a silicon nitride film, and a first conductive layer are sequentially laminated on the patterned sacrificial layer. The lower electrode 123 is patterned in the first conductive layer. The piezoelectric layer 125 and a second conductive layer are sequentially laminated on the lower electrode 123. The upper electrode 127 is patterned in the second conductive layer. The third air cavity 141 is formed by removing the sacrificial layer patterned below the electrode 140.

Conductive materials for the first conductive layer and the second conductive layer may include, for example, gold, molybdenum, ruthenium, aluminum, platinum, titanium, tungsten, palladium, chromium, nickel, and the like. Additionally, piezoelectric materials for the piezoelectric layer 125 may include, for example, zinc oxide (ZnO), aluminum nitride (AlN), quartz, and the like. However, the materials for the first conductive layer and piezoelectric materials are not limited to those listed here.

The via hole 113 is formed in the first substrate 110 by etching the bottom surface of the first substrate 110, so that either the lower electrode 123 or the upper electrode 127 may be connected to an external element through the via hole 113. Specifically, when the first substrate 110 is made of silicon materials, the via hole 113 may be generated by wet etching the bottom surface of the first substrate 110 using a crystallographic direction of silicon. Here, the etched surface of the first substrate 110 may be inclined by the crystallographic direction. Additionally, when the crystallographic direction is not matched to the wet etching, or when the first substrate 110 is made of materials other than silicon, the via hole 113 may be formed by dry etching.

Additionally, in another example of a method of manufacturing a BAWR, the air cavity 151 may be formed in the predetermined area of the bottom surface of the second substrate 150, and the second substrate 150 may be bonded to the first substrate 110 using the bonding metal 153. The air cavity 151 may accommodate the first lamination resonating portion 120 and the second lamination resonating portion 130 that are formed in the first substrate 110.

Additionally, in still another example of a method of manufacturing a BAWR, the insulating layer 115 and a conductive layer may be deposited in a lower part of the via hole 113 that is generated below either the lower electrode 123 or the upper electrode 127. The electrode pad 117 may be formed by patterning the conductive layer.

Additionally, in yet another example of a method of manufacturing a BAWR, a lower part of the electrode pad 117 may be coated with a flux. The flux may be used in a pre-processing operation of attaching a solder ball to the electrode pad 117.

Figure 2:
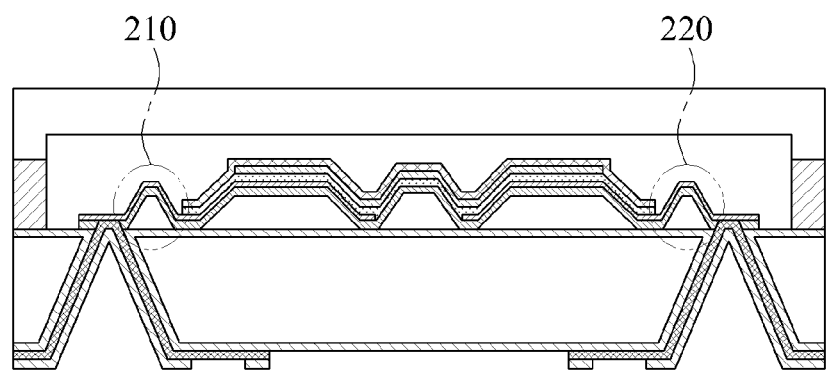
FIG. 2 is a diagram illustrating another example of a lamination structure of a BAWR.

FIG. 2 illustrates another example of a lamination structure of a BAWR.

As shown in the example of FIG. 2, second electrode portions 210 and 220 may be added to the lamination structure of FIG. 1.

With reference to the examples in FIG. 1 and FIG. 2, the second electrode portion 210 includes an electrode to connect the first lamination resonating portion 120 and the via hole 113.

More specifically, the lower electrode 123 or the upper electrode 127 of the first lamination resonating portion 120 may be connected to the electrode pad 117 of the via hole 113. Similar to the first electrode portion 140, a power loss amount may be increased as a contact area between the second electrode portion 210 and the first substrate 110 increases. Accordingly, the second electrode portion 210 includes a fourth air cavity and thus, an amount of power loss may be reduced.

A process of forming the fourth air cavity in the second electrode portion 210 may be similar to a process of forming the first to third air cavities 121, 131, 141, and the fourth air cavity may be formed during the same process as the first to third air cavities 121, 131, 141, thereby preventing or limiting additional costs from being incurred. When a contact area between the second electrode portion 210 and the first substrate 110 is greater than a necessary contact area, the second electrode portion 210 may include the fourth air cavity. This is because when the contact area between the second electrode portion 210 and the first substrate 110 is less than the necessary contact area, the second electrode portion 210 may not be able to function as an electrode.

The second electrode portion 220 includes an electrode to connect the second lamination resonating portion 130 and a via hole. The second electrode portion 220 also includes an air cavity to minimize a contact area between the second electrode portion 220 and the first substrate 110, similar to the second electrode portion 210.

In one example of a method of forming an air cavity in the second electrode portion 210, a sacrificial layer may be patterned into a shape of an air cavity to be generated, below an electrode connecting the first lamination resonating portion 120 and the via hole 113. The air cavity may be formed by removing the patterned sacrificial layer. That is, the electrode positioned on at least part of the sacrificial layer may conform to the pattern and shape of the sacrificial layer. Once the sacrificial layer is removed, a cavity is left in the electrode which corresponds to the pattern and shape of the sacrificial layer.

Similarly, in an example of a method of forming an air cavity in the second electrode portion 220, a sacrificial layer may be patterned into a shape of an air cavity to be formed, below an electrode connecting the second lamination resonating portion 130 and the via hole. The air cavity may be formed by removing the patterned sacrificial layer.

Figure 3:
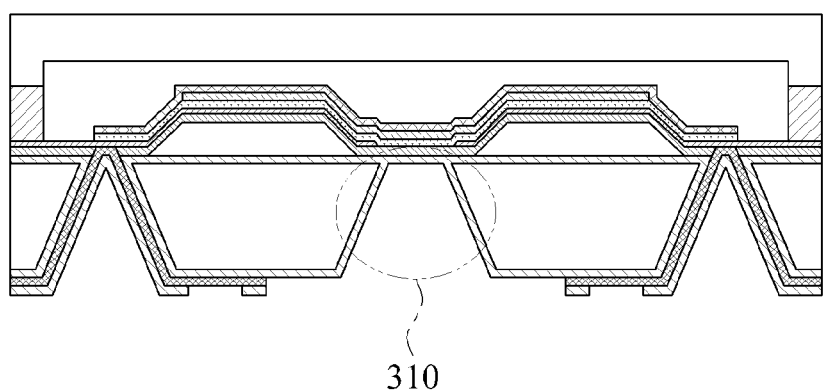
FIG. 3 is a diagram illustrating still another example of a lamination structure of a BAWR.

FIG. 3 illustrates still another example of a lamination structure of a BAWR.

As shown in the example of FIG. 3, and with reference to FIG. 1, the third air cavity 141 of the first electrode portion 140 of FIG. 1 may be replaced with a via hole 310.

The first electrode portion 140 includes the third air cavity 141 to minimize or reduce a contact area with the first substrate 110 as shown in the example of FIG. 1. Specifically, the third air cavity 141 may be formed by removing a sacrificial layer between the first substrate 110 and either the lower electrode 123 or the upper electrode 127. Either the lower electrode 123 or the upper electrode 127 may connect the first lamination resonating portion 120 and the second lamination resonating portion 130.

Additionally, in the example shown in FIG. 3, the third air cavity 141 may be generated by forming the via hole 310 on the first substrate 110 located below either the lower electrode 123 or the upper electrode 127, without using the sacrificial layer. Either the lower electrode 123 or the upper electrode 127 may connect the first lamination resonating portion 120 and the second lamination resonating portion 130.

In this example, the via hole 310 is formed below the first electrode portion 140 and thus, a contact area between an electrode and a silicon substrate may be reduced, thereby obtaining a similar effect as the third air cavity 141 in the example of FIG. 1. The via hole 310 may penetrate the first substrate 110 by etching the bottom surface of the first substrate 110. Additionally, the via hole 310 and the via hole 113 may be formed through the same process and thus, it is possible to reduce manufacturing costs.

Figure 4:
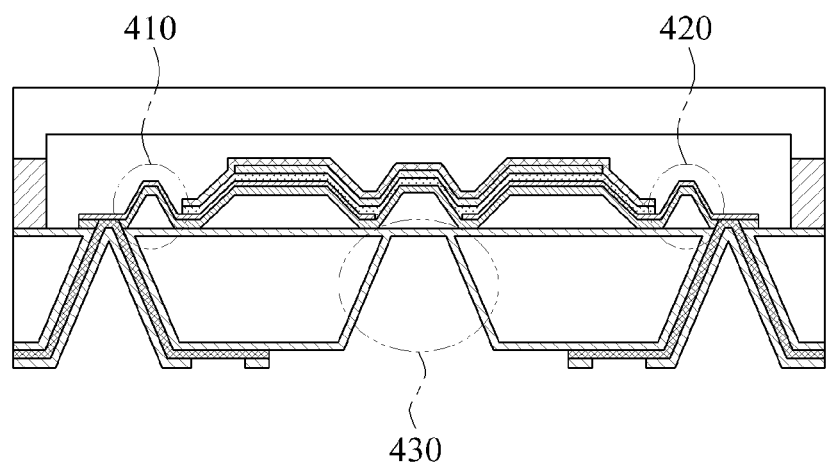
FIG. 4 is a diagram illustrating yet another example of a lamination structure of a BAWR.

FIG. 4 illustrates another example of a lamination structure of a BAWR.

As shown in the example of FIG. 4, second electrode portions 410 and 420 may be added to the lamination structure shown in the example of FIG. 3.

In this example, the second electrode portion 410 includes an electrode to connect the first lamination resonating portion 120 and the via hole 113.

More specifically, either the lower electrode 123 or the upper electrode 127 of the first lamination resonating portion 120 may be connected to the electrode pad 117 of the via hole 113. The power loss amount may be increased where the contact area between the second electrode portion 410 and the first substrate 110 increases. Accordingly, in this example, an air cavity is formed in the second electrode portion 410 and thus, the power loss amount may be reduced.

A process of forming an air cavity in the second electrode portion 410 may be similar to the process of forming the first to third air cavities 121, 131, 141, and the air cavity may be formed during the same process as the first to third air cavities 121, 131, 141, and may thereby reduce manufacturing costs. When a contact area between the second electrode portion 410 and the first substrate 110 is greater than a necessary contact area, the second electrode portion 410 may include the air cavity.

The second electrode portion 420, in this example, includes an electrode to connect the second lamination resonating portion 130 and a via hole. The second electrode portion 420 also includes an air cavity to minimize or reduce a contact area with the first substrate 110, similar to the second electrode portion 410.

The air cavity of the first electrode portion 140 may be formed by generating a via hole 430 by etching the bottom surface of the first substrate 110 in a location corresponding to a lower part of either the lower electrode 123 or the upper electrode 127 that connects the first lamination resonating portion 120 and the second lamination resonating portion 130. The via holes 430 and 113 may be formed through the same process, and may thereby reduce manufacturing costs.

Figure 5:
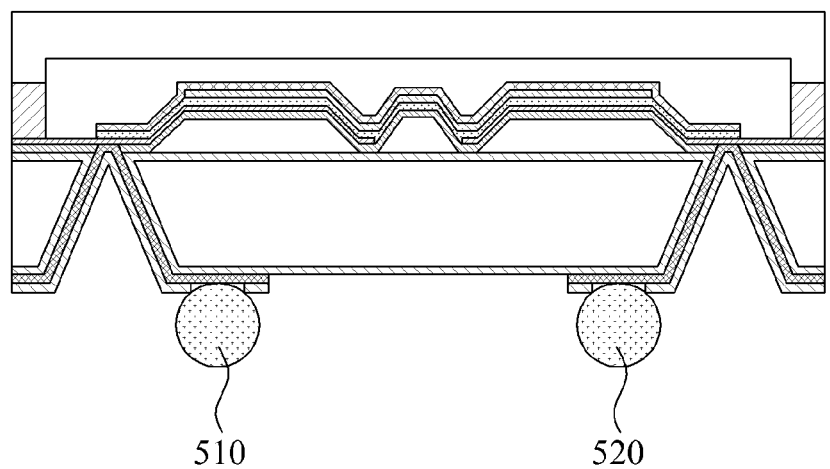
FIG. 5 is a diagram illustrating an example of a lamination structure of a BAWR including solder balls.

FIG. 5 illustrates an example of a lamination structure of a BAWR including solder to balls.

As shown in the example of FIG. 5, solder balls 510 and 520 may be added to the lamination structure of FIG. 1. A solder ball may enable an electrode of a BAWR to be connected to the outside. More specifically, the lower electrode 123 of the first lamination resonating portion 120 may be connected to the electrode pad 117 of the via hole 113. The solder ball 510 may be formed on the electrode pad 117, and may be bonded to an external element, so that the lower electrode 123 may be connected to the outside.

A conductive layer and an insulating layer may be laminated below the first substrate 110 and on the via hole 113, and may be patterned, so that only a conductive layer in a predetermined area is exposed. The exposed conductive layer may be referred to as an electrode or an electrode pad. The solder balls 510 and 520, or a solder bump may be attached to a lower part of the electrode.

A plurality of electrodes laminated below the first substrate 110 may be arranged in a central direction of the first substrate 110. The plurality of electrodes may be rearranged in the central direction of the first substrate 110 so that the plurality of electrodes may not be in contact with each other, and a plurality of solder balls may be attached. Accordingly, the plurality of solder balls may be attached by rearranging the plurality of electrodes, without a need to increase a size of the first substrate 110.

Figure 6:
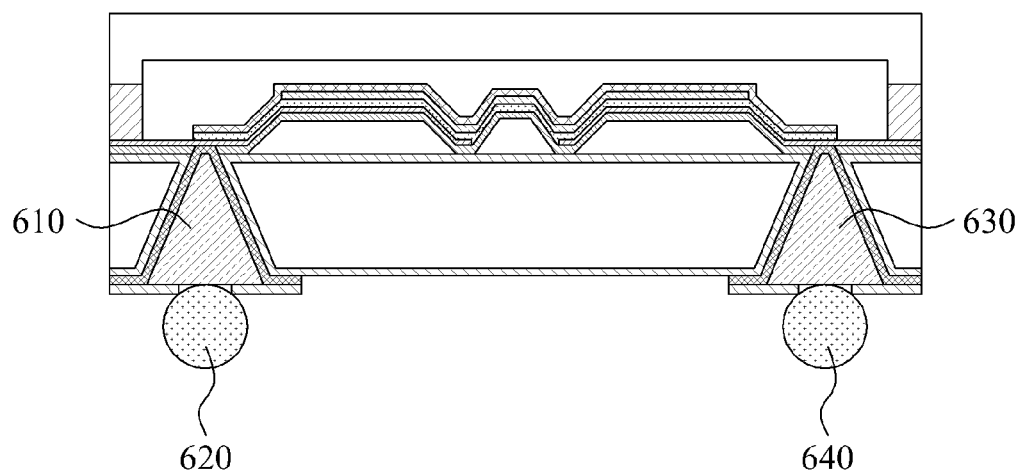
FIG. 6 is a diagram illustrating another example of a lamination structure of a BAWR including solder balls.

FIG. 6 illustrates another example of a lamination structure of a BAWR including a solder ball.

As shown in the example of FIG. 6, the via holes of FIG. 1 may be filled with conductive materials 610 and 630, and solder balls 620 and 640 may be attached.

In an example of a method of manufacturing the BAWR of FIG. 6, the via holes of the first substrate 110 are filled with the conductive materials 610 and 630, surfaces of the via holes filled with the conductive materials 610 and 630 smoothed, and the smoothed surfaces patterned with an insulating layer. The solder balls 620 and 640 or a solder bump may be attached to exposed portions of the patterned surfaces. The solder balls 620 and 640 may be formed below the surfaces of the via holes filled with conductive materials 610 and 630. The filling operation may be performed using at least one of an electroplating scheme, an electroless plating scheme, and a solder paste filling scheme.

Thus, the distance between an electrode of the BAWR and an external electrode may be reduced or minimized by filling the via hole with the conductive materials 610 and 630. Additionally, reduction in electrical resistance may occur when the conductive materials 610 and 630 are used.

Figure 7:
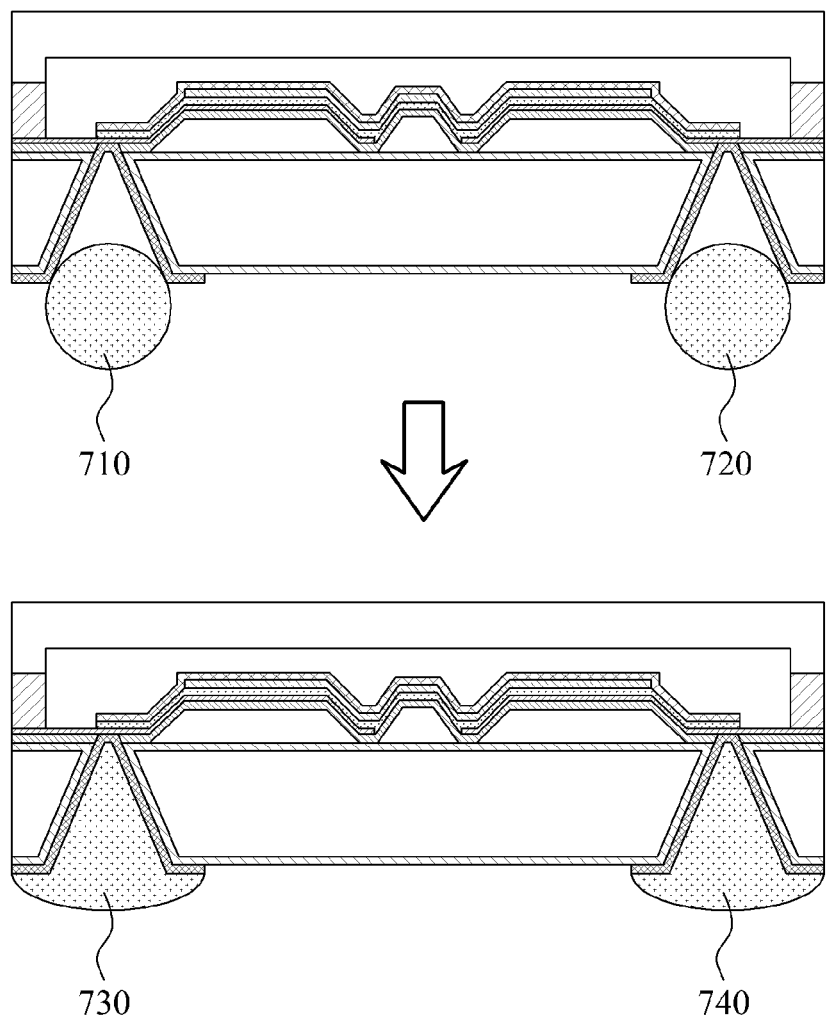
FIG. 7 is a diagram illustrating an example of a lamination structure of a BAWR including solder bumps.

FIG. 7 illustrates an example of a lamination structure of a BAWR including solder bumps.

As shown in the example of FIG. 7, solder bumps 730 and 740 may be laminated within a via hole and in a predetermined area of a lower part of a first substrate in the lamination structure of FIG. 1.

In an example of a method of manufacturing the BAWR of FIG. 7, an electrode connected to an external element is laminated below a first substrate and in a via hole. Solder balls 710 and 720, instead of an insulating layer, may be attached to a lower part of the laminated electrode. The attached solder balls 710 and 720 may be reflowed by heating, and laminated in the via hole and in the predetermined area of the lower part of the first substrate. The predetermined area of the lower part of the first substrate may be determined by changing a heating condition during reflow of the solder balls 710 and 720. Here, the reflowed solder balls 710 and 720 may be defined as solder bumps 730 and 740. The solder bumps 730 and 740 may be attached directly onto the lower part of the electrode and thus, a distance between the electrode of the BAWR and an external electrode may be minimized. Additionally, a manufacturing process may be simplified using solder bumps, without a need to fill the via hole with conductive materials.

A duplexer using a BAWR according to the examples above may include a first filter, a second filter, and a phase shifter.

The first filter may transmit, via an antenna, a signal input through a transmission terminal. The first filter may be implemented as a lamination resonating portion including an air cavity, a lower electrode, a piezoelectric layer and an upper electrode.

The second filter may filter a signal received via the antenna at a predetermined frequency, and control the filtered signal to be output to a receiving terminal. The second filter may also be implemented as a lamination resonating portion including an air cavity, a lower electrode, a piezoelectric layer, and an upper electrode. The first filter and the second filter may be operated at different resonance frequencies, and the different resonance frequencies may be determined depending on a thickness of the piezoelectric layer.

Additionally, an electrode portion may be configured to connect the first filter and the second filter through an electrode, and may include an air cavity formed below the electrode. Since the first filter and the second filter may be implemented as lamination resonating portions, the electrode portion may be configured to connect a plurality of lamination resonating portions through the electrode. The air cavity may be formed below the electrode and accordingly, a contact area between the electrode and a substrate of a device may be reduced, thereby reducing the power loss amount.

The phase shifter may change a phase of a signal that is transceived between the antenna and the second filter, and may prevent an interference of the signal from occurring in the first filter and the second filter.

According to the examples above, power loss through an electrode may be limited or prevented by using a BAWR having a structure where an air cavity is formed below an electrode connecting resonators.

Additionally, according to the examples above, an expensive high-resistance wafer used to reduce a power loss may be replaced with a general wafer by using a BAWR having a structure where an air cavity is formed below an electrode connecting resonators. Thus, manufacturing costs of a Radio Frequency (RF) filter may be reduced.

Furthermore, according to the examples above, power loss through an electrode may be limited or prevented by using a BAWR having a structure where an air cavity is formed below an electrode connecting resonators, thereby reducing a driving power of the resonators.

Moreover, according to the examples above, a loss in a driving power of a resonator, may be reduced by using a via hole formed on a lower surface of a substrate and using a solder ball formed directly in the via hole.

In addition, according to the examples above, an air cavity may be formed below an electrode through the same manufacturing process as a current resonator and with the same manufacturing costs as the current resonator, without an additional process.

Furthermore, according to examples above, an air cavity may be added without changing characteristics of a resonator that includes, for example, a resonance frequency, a bandwidth, and a coefficient of performance.

It is understood that the features of the present disclosure may be embodied in different forms and should not be construed as limited to the example embodiments set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A bulk acoustic wave resonator (BAWR), comprising:
a first substrate comprising a via hole positioned in a predetermined area of a bottom surface of the first substrate;
a first lamination resonating portion comprising a first air cavity, and a first lower electrode-piezoelectric layer-upper electrode laminate, the first air cavity being positioned above the first substrate, and the first lower electrode-piezoelectric layer-upper electrode laminate being positioned above the first air cavity;
a second lamination resonating portion comprising a second air cavity, and a second lower electrode-piezoelectric layer-upper electrode laminate, the second air cavity being positioned above the first substrate, and the second lower electrode-piezoelectric layer-upper electrode laminate being positioned above the second air cavity; and
a first electrode portion comprising a cavity, a piezoelectric layer, and an upper electrode positioned on the piezoelectric layer, the first electrode portion being positioned to connect the first lamination resonating portion and the second lamination resonating portion via the upper electrode, and the cavity being positioned below the upper electrode and the piezoelectric layer.

2. The BAWR of claim 1, further comprising:
a second substrate comprising an air cavity positioned in a predetermined area of a bottom surface of the second substrate, the second substrate being bonded to the first substrate.

3. The BAWR of claim 1, wherein the cavity is positioned between the first substrate and the upper electrode.

4. The BAWR of claim 1, further comprising:
a second electrode portion comprising a third air cavity and a lower electrode without the piezoelectric layer, the third air cavity positioned in a bottom surface of the lower electrode, and the lower electrode being connected to an electrode laminated in the via hole of the first substrate,
wherein the first lamination resonating portion and the second lamination resonating portion are connected to the electrode laminated in the via hole of the first substrate through the lower electrode.

5. The BAWR of claim 1, further comprising:
a solder ball attached to an electrode laminated below the first substrate and in the via hole of the first substrate, the electrode being configured to connect to an external element.

6. The BAWR of claim 1, further comprising:
a solder ball attached to a surface of the via hole of the first substrate, which is filled with a conductive material.

7. The BAWR of claim 1, further comprising:
a solder bump positioned below an electrode laminated in the via hole of the first substrate and in a predetermined area below the first substrate, the electrode being configured to connect to an external element.

8. The BAWR of claim 1, wherein the cavity is filled with air, or inert gas, or silicon oxide, or silicon nitride, or polysilicon, or polymer.

9. A bulk acoustic wave resonator (BAWR), comprising:
a first substrate comprising a via hole positioned in a predetermined area of a bottom surface of the first substrate;
a first lamination resonating portion comprising a first air cavity a first lower electrode-piezoelectric layer-upper electrode laminate, the first air cavity being positioned above the first substrate, and the first lower electrode-piezoelectric layer-upper electrode laminate being positioned above the first air cavity;
a second lamination resonating portion comprising a second air cavity, and a second lower electrode-piezoelectric layer-upper electrode laminate, the second air cavity being positioned above the first substrate, and the second lower electrode-piezoelectric layer-upper electrode laminate being positioned above the second air cavity; and
a first electrode portion positioned to connect the first lamination resonating portion and the second lamination resonating portion via either a lower electrode or an upper electrode, the first electrode portion comprising a third air cavity positioned below either the lower electrode or the upper electrode,
wherein the third air cavity is positioned by a via hole positioned below either the lower electrode or the upper electrode, and the via hole extends into the first substrate.

10. A duplexer using a bulk acoustic wave resonator (BAWR), the duplexer comprising:

a first filter configured to transmit, via an antenna, a signal input through a transmitting terminal;

a second filter configured to control a signal received via the antenna to be output to a receiving terminal; and a phase shifter configured to change a phase of a signal, and prevent an interference of the signal from occurring in the first filter and the second filter, the signal being transceived between the antenna and the second filter, wherein the first filter and the second filter are operated at different predetermined resonance frequencies, and wherein the first filter and/or the second filter comprises a first lamination resonating portion comprising a first air cavity, and a first lower electrode-piezoelectric layer-upper electrode laminate, the first air cavity being positioned above a first substrate, and the first lower electrode-piezoelectric layer-upper electrode laminate being positioned above the first air cavity, a second lamination resonating portion comprising a second air cavity, and a second lower electrode-piezoelectric layer-upper electrode laminate, the second air cavity being positioned above the first substrate, and the second lower electrode-piezoelectric layer-upper electrode laminate being positioned above the second air cavity, and an electrode portion comprising a cavity, a piezoelectric layer, and an upper electrode positioned on the piezoelectric layer, the electrode portion being positioned to connect the first lamination resonating portion and the second lamination resonating portion via the upper electrode, and the cavity being positioned below the upper electrode and the piezoelectric layer.

* * * * *